United States Patent [19]

Heinen et al.

[11] Patent Number: 4,506,227
[45] Date of Patent: Mar. 19, 1985

[54] MASS SPECTROMETER

[75] Inventors: Raymond Heinen, Cologne; Horst Stelling, Pulheim, both of Fed. Rep. of Germany

[73] Assignee: Leybold Heraeus GmbH, Cologne, Fed. Rep. of Germany

[21] Appl. No.: 380,312

[22] Filed: May 20, 1982

[30] Foreign Application Priority Data

May 21, 1981 [DE] Fed. Rep. of Germany ....... 3120196

[51] Int. Cl.³ .............................................. H03L 5/02
[52] U.S. Cl. ....................................... 328/33; 331/181; 331/177 R; 331/177 V; 250/292; 328/155; 324/79 R; 307/314
[58] Field of Search .................... 331/177 R, 177 V; 324/79 R; 328/155, 31, 33; 307/511, 514, 314; 250/290, 292

[56] References Cited

U.S. PATENT DOCUMENTS

| 3,410,998 | 11/1968 | Watters | 250/292 |
| 4,039,930 | 8/1977 | Lukas | 328/155 |
| 4,123,725 | 10/1978 | Davis | 331/177 V |
| 4,270,098 | 5/1981 | Bowman | 331/177 V |
| 4,341,999 | 7/1982 | Rudish et al. | 328/155 |

FOREIGN PATENT DOCUMENTS 0676238  7/1952  United Kingdom .

Primary Examiner—John S. Heyman

[57] ABSTRACT

A resonant-circuit, high-frequency electrical power supply for a mass spectrometer has a transductor for magnetically retuning the power supply in response to tuning variations produced by operating variations in the mass spectrometer.

5 Claims, 4 Drawing Figures

MASS SPECTROMETER

BACKGROUND

The invention relates to a mass spectrometer, and preferably a quadrupole mass spectrometer, having a power supply resonant circuit.

Mass spectrometers, and especially quadrupole mass spectrometers, require for their operation, depending on their construction and mass range, voltages of from a few hundred to a few thousand volts with frequencies of a few megahertz. These operating voltages are produced, generally by resonant circuits, because only a very low effective power is required. The mass-spectrometer system itself, including the quadrupole electrodes, plugs, conductors, etc., constitutes the resonant circuit capacity. The frequency of the operating voltage is an important operating parameter, affecting the separation of operating ions passing through the mass spectrometer. It is therefore usually set by controlling the resonant circuit with a quartz-crystal-controlled oscillator.

Furthermore, to achieve good efficiency, the quality factor of the resonant power circuit is usually high. This, however, increases the danger that even slight detuning of the circuit will produce large changes. Such detuning occurs when, for example, cables or measuring heads of the mass spectrometer are changed because these are part of the capacity of the resonant power circuit. Also, aging and temperature effects produce such detuning. Even keeping the amplitude of the high-frequency alternating current stable by means of a regulating circuit does not result in any appreciable improvement, since the detuning has an effect on the curve shape and thus adversely affects the sensitivity of a quadrupole mass spectrometer.

To avoid these difficulties, it is known to equip the high-frequency operating-power generator for a quadrupole mass spectrometer with a manually-operated equalizer for maintaining the resonance. A disadvantage of this is that such adjustment can only be performed by highly skilled persons. When the apparatus is used by persons with inadequate training and knowledge of the physical processes involved in a mass spectrometer, there is therefore always the danger of inaccurate or even erroneous results.

THE INVENTION

It is the object of the present invention to provide a high-frequency power-supply for a mass spectrometer which avoids the need for manual adjustment of the power-supply resonant circuit.

This object is achieved in accordance with the invention in that a controllable reactance in the high-frequency power-supply resonant circuit of a mass spectrometer is controlled by a voltage proportional to the angle between the voltage and the current of the high-frequency oscillation from a phase detector for automatic resonance tuning. The control voltage acting on the reactance or reactances can be formed, for example, by obtaining the sum of the voltage delivered by the phase detector plus an additional equalizing voltage. This equalizing voltage is set once by the manufacturer, and each time that the apparatus is turned on it forms the necessary reference voltage.

The important advantage of a mass spectrometer operating in this manner consists in the fact that it is no longer necessary to tune the resonant circuit by hand before performing the measurements. Even during operation, the resonance always equalizes itself. The manipulation of the apparatus is thus rendered especially simple, and the danger of measurement error is largely reduced.

Suitable phase detectors are not only analog circuits of the mixer, modulator, product detector or coincidence detector type, but also digital circuits which by means of a plurality of flip-flops, forward-backward counters or antivalence or equivalence gates convert the phase shift between two signals to a control voltage or a series of pulses.

Controllable reactances are the capacitor and/or the inductance of the power resonant circuit. A controllable capacitor can best be selected in the form of a condenser having a material as its dielectric whose $\epsilon_r$ is dependent upon field strength, so that the magnitude of its capacity is adjustable within certain limits by a voltage.

A controllable inductance can best be a transductor in which the magnitude of the inductance is controlled by a control current.

Additional advantages and details of the invention are explained with the aid of embodiments represented schematically in the Figures, wherein.

Figure 1:
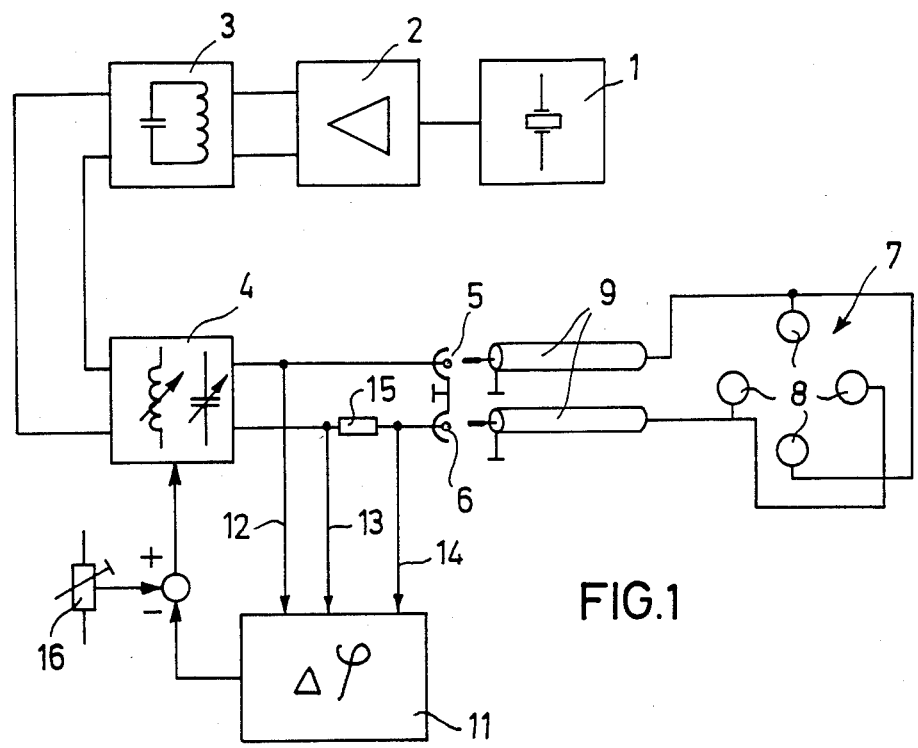
FIG. 1 is a schematic of a first embodiment with connected quadrupole mass spectrometer.
Figure 2:
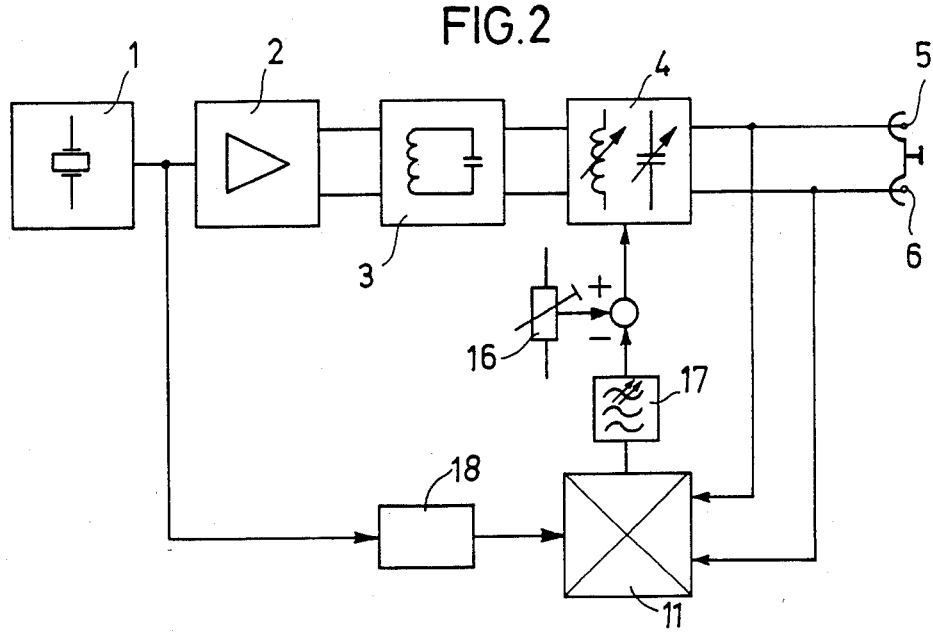
FIG. 2 is a schematic of a second embodiment without connected quadrupole mass spectrometer.

FIGS. 1 and 2 show embodiments of a high frequency generator of the invention in block diagrams. 1 represents a crystal-controlled oscillator, 2 a power amplifier, 3 a resonant power circuit and 4 a controlled reactance which can be either a variable condenser, a variable inductance, or both. 5 And 6 designate output terminals to which, as represented only in FIG. 1, poles 8 of a quadrupolar mass spectrometer 7 are connected through shielded cable 9.

In the embodiment represented in FIG. 1 a phase detector 11 is provided to detect the high frequency, and to it is fed through line 12 both the voltage $U_R$ applied to the output terminals 5 and 6 and, through the lines 13 and 14 a voltage proportional to the output current $I_R$. For the production of the voltage proportional to the current there is provided the resistance 15 inserted in one output line. The phase detector 11 delivers at its output a voltage $U_\Delta$ which corresponds to the phase shift between the voltage and current, and thus represents a measure of the tuning of the power oscillator circuit.

From this voltage $U_\Delta$ and an additional equalization voltage $U_{Ab}$, which is taken from the variable resistance 16, the control voltage $U_{st}$ for the controllable reactance is formed by summation, namely in accordance with the following equation:

$$U_{st} = U_{Ab} - U_\Delta \qquad [1]$$

The phase angle between current and voltage at the power oscillator can be represented approximately as follows, simplified and linearized, in relation to the tuning by a controllable reactance and other tuning influences:

$$\phi = \phi_0(1 + V + K_2 \cdot U_{st}) \qquad [2]$$

wherein $\phi_0$ is the phase angle which establishes itself without tuning. V is the tuning by external influences and $K_2 \cdot U_{st}$ is the amount that is produced by reactance control. If the relation $U_A = K_1 \cdot \rho$ and equation [1] is inserted into [2], the result is $$\phi = \phi_0 \frac{1 + V + K_2 U_{Ab}}{1 + K_1 K_2} \qquad [3]$$

and furthermore $$\phi = \phi_0 \frac{\frac{1+V}{K_2} + U_{Ab}}{\frac{1}{K_2} + K_1} \qquad [4]$$

on the condition that $K_2 \gg 1 + V$ [5] equation [4] can be simplified to $$\phi = \phi_0 \cdot \frac{U_{Ab}}{K_1} \qquad [6]$$

If condition [5] is sufficiently fulfilled, the expression [6] is independent of V. The phase angle that establishes itself is therefore additionally determined only by the compensating voltage $U_{Ab}$.

In the embodiment represented in FIG. 2, a phase detector 11 is provided, which is in the form of an analog or digital circuit. Since the output signal from such a circuit is a mixed product with a large number of harmonics of which only the DC content is of interest, a low-pass filter 17 is connected to the output of the phase detector 11 and its output together with the voltage drop across the resistance 16 forms the voltage controlling the variable reactance. Furthermore, in the case of a product detector, a 90° phase shift circuit 18 is necessary, which receives its signals directly from the crystal-controlled oscillator. This phase shift circuit is necessary since the output signal from a product detector is unambiguous only in the angular range between 0° and 180°, but for the detection of resonance a range of only ±90° is needed.

Figure 3:
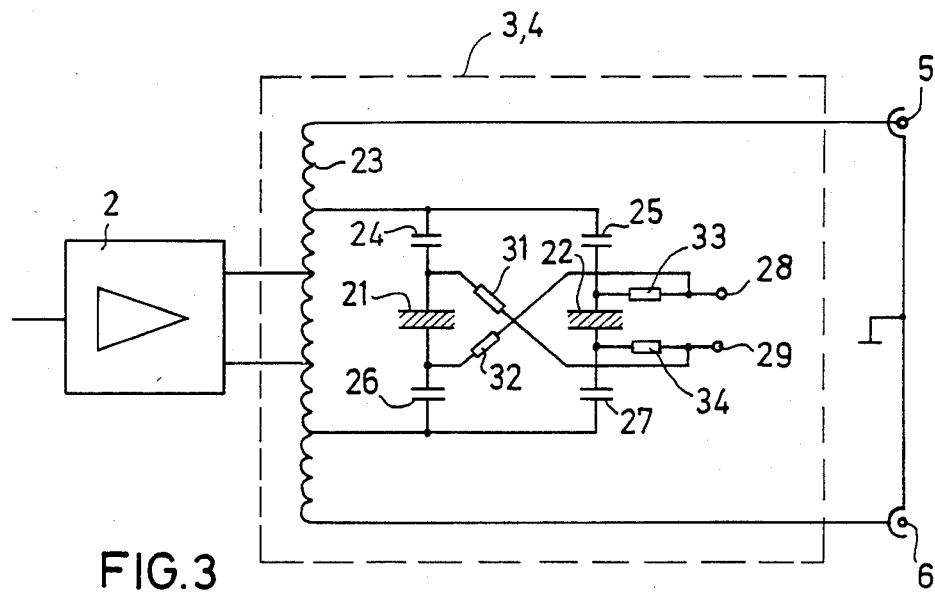
FIG. 3 is a more-detailed schematic of one embodiment of portions of FIGS. 1 and 2.

In FIG. 3 there is represented a power resonant circuit whose resonance is tunable by means of variable condensers 21 and 22. These condensers together with the inductance 23 form the power resonant circuit 3 (in accordance with FIGS. 1 and 2) which receives the output of the power amplifier 2. The condensers 21 and 22 are applied in parallel through the coupling condensers 24 to 27 to taps in the inductance 23 of the principal circuit. The control voltage $U_{st}$ is delivered through the terminals 28 and 29 and applied through high-frequency chokes 31, 32 and 33, 34 to the two capacitors with reversal. In a circuit constructed in this manner it can be brought about that the applied control voltage becomes greater than the high-frequency voltage, so that, in the event of a nonlinear relationship between the voltage and the capacity of the variable condensers, the distortions of the high frequency will not be too severe. Condensers having a field-strength-related $\epsilon_r$ use, for example, barium titanate or calcium titanate as dielectric. The capacity of such condensers is variable within certain limits. The relationship between the control voltage and capacity is not, however, linear.

In the embodiment represented in FIG. 3, the inductance and the capacity of the main circuit have the values of 20 microhenries and 240 picofarads, respectively. The high frequency thereby produced amounts to about 2.3 MHz. The capacitors 21 and 22 are variable between 50 and 500 pF. The control voltage amounts to several hundred volts.

Figure 4:
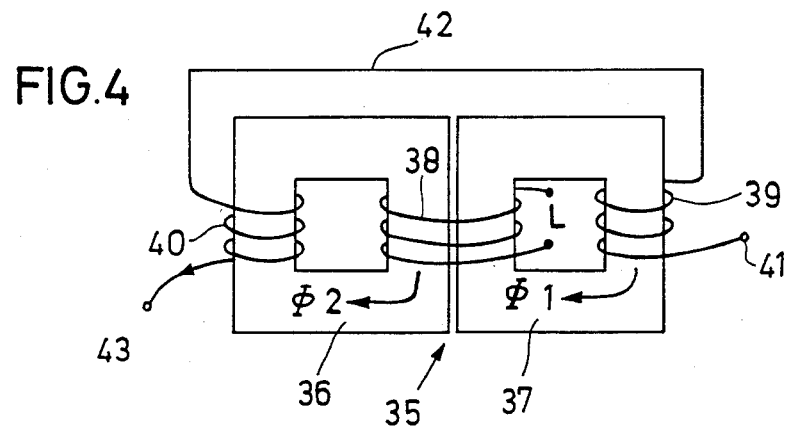
FIG. 4 is a more-detailed schematic of another embodiment of a portion of FIGS. 1 and 2.

FIG. 4 shows an embodiment of a variable inductance 35. Such inductances use a ferromagnetic material (certain ferrites) as their core. An inductance is thus obtained whose magnitude is controlled by an additional magnetic flux. A variable inductance operating on this principle is known as a transductor. In the embodiment represented in the drawing, two magnetic cores 36 and 37 are provided. The juxtaposed portions form with the winding 38 the inductance L of the main circuit. To control this inductance L, the free sections of the magnetic cores 36 and 37 are equipped with contrary windings 39 and 40 through which the control current flows. For this purpose the control current is fed at 41 to winding 39 and through line 42 to winding 40. The output terminal is marked 43. In this embodiment it is brought about that the controlling current is divided into two opposite fluxes $\Phi_1$ and $\Phi_2$ flowing through the coil that is to be influenced, thereby preventing distortions. Furthermore, it is desirable even in the case of variable inductances to make the high-frequency flux small in relation to the controlling DC flux so as to avoid a distorting influence of nonlinearity on the HF amplitude.

Typical inductances for the embodiment shown in FIG. 4 are around 0.5 to 5 microhenries for a high frequency of 2.3 MHz and 240 microhenries and 240 picofarads, respectively, in the main circuit.

We claim:
1. In a mass spectrometer having a resonant-circuit high-frequency electrical power supply for the operation thereof and at least one component which variably detunes the resonance of the circuit and thus the high frequency of the power supply and the operation of the mass spectrometer, the improvement comprising:
   phase detector means for detecting the relative phase of the current and voltage of the power supply;
   a transductor in the power supply for varying the resonance and thus the high frequency of the power supply in response to a magnetic flux; and
   means responsive to the relative phase detected by the phase detector means and producing the magnetic flux in the transductor in a way which thereby varies the resonance and thus the high frequency of the power supply for retuning the latter.
2. The mass spectrometer of claim 1, wherein the transductor comprises two magnetic cores having juxtaposed portions and a winding thereabout as an inductance of the power supply; and the means producing the magnetic flux in the transductor comprises a winding about each respective core connected to the phase detector means.
3. The mass spectrometer of claim 2, wherein the windings are oppositely wound.
4. The mass spectrometer of claim 1, wherein the phase detector means comprises a switching device.
5. The mass spectrometer of claim 4, wherein the phase detector further comprises a low pass filter connected between the switching device and the means responsive to the phase detector means.

* * * * *